(12) United States Patent
Tamura et al.

(10) Patent No.: US 12,055,567 B2
(45) Date of Patent: Aug. 6, 2024

(54) CURRENT DETECTION DEVICE

(71) Applicant: Alps Alpine Co., Ltd., Tokyo (JP)

(72) Inventors: Manabu Tamura, Miyagi-ken (JP); Masaomi Shirasaka, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 184 days.

(21) Appl. No.: 17/742,901

(22) Filed: May 12, 2022

(65) Prior Publication Data

US 2022/0268816 A1 Aug. 25, 2022

Related U.S. Application Data

(63) Continuation of application No. PCT/JP2020/040815, filed on Oct. 30, 2020.

(30) Foreign Application Priority Data

Nov. 15, 2019 (JP) ................................ 2019-207066

(51) Int. Cl.
*G01R 15/20* (2006.01)
*G01R 19/00* (2006.01)

(52) U.S. Cl.
CPC ......... *G01R 15/205* (2013.01); *G01R 15/207* (2013.01); *G01R 19/0092* (2013.01)

(58) Field of Classification Search
CPC . G01R 15/205; G01R 15/207; G01R 19/0092
See application file for complete search history.

(56) References Cited

U.S. PATENT DOCUMENTS

| | | | |
|---|---|---|---|
| 10,330,707 B2 | 6/2019 | Abe | |
| 10,746,821 B2 | 8/2020 | Esaka et al. | |
| 10,877,071 B2 | 12/2020 | Okuyama et al. | |
| 2017/0082659 A1* | 3/2017 | Harada | ................... G01R 15/20 |
| 2017/0285076 A1* | 10/2017 | Okuyama | ............ G01R 33/093 |
| 2018/0166673 A1* | 6/2018 | Kataoka | ............ H01M 10/4207 |
| 2019/0187187 A1* | 6/2019 | Umetsu | .................... G01R 1/04 |
| 2020/0256895 A1* | 8/2020 | Okuyama | ............ G01R 15/148 |

FOREIGN PATENT DOCUMENTS

| | | |
|---|---|---|
| JP | 2015-49184 | 3/2015 |
| JP | 2015-108554 A | 6/2015 |
| JP | 2017-72467 | 4/2017 |
| JP | 2019-109126 | 7/2019 |
| WO | WO 2015/178478 | 11/2015 |
| WO | WO2016/148022 | 9/2016 |
| WO | WO2017/217267 | 12/2017 |
| WO | WO 2019/117171 A1 | 6/2019 |

OTHER PUBLICATIONS

International Search Report from corresponding International Application No. PCT/JP2020/040815, Jan. 12, 2021, 11pp.

* cited by examiner

*Primary Examiner* — Dominic E Hawkins
(74) *Attorney, Agent, or Firm* — Crowell & Moring LLP (57) ABSTRACT

In a current detection device, a first shield plate is disposed adjacent to a magnetic sensor and a second shield plate is disposed adjacent to the bus bar so that the first and second shield plates sandwich the bus bar and the magnetic sensor in the thickness direction of the bus bar. A plurality of the first shield plates adjacent to the magnetic sensors are an integral part of a cover. At least part of the cover is separated between adjacent two of the first shield plates, and a plurality of the second shield plates disposed adjacent to the bus bars are an integral part of a casing.

8 Claims, 6 Drawing Sheets

CURRENT DETECTION DEVICE

CLAIM OF PRIORITY

This application is a Continuation of International Application No. PCT/JP2020/040815 filed on Oct. 30, 2020, which claims benefit of priority to Japanese Patent Application No. 2019-207066 filed on Nov. 15, 2019. The entire contents of each application noted above are hereby incorporated by reference.

BACKGROUND

1. Field of the Disclosure

The present disclosure relates to a current detection device capable of measuring a current flowing through a bus bar.

2. Description of the Related Art

A current sensor described in Japanese Unexamined Patent Application Publication No. 2017-72467 includes two shield plates disposed facing each other in a parallel flat plate shape, three bus bars arranged in parallel so as to be located in an accommodation space formed between the shield plates, and detection elements each provided corresponding to one of the bus bars. Each of the shield plates has portions each corresponding to a space between two adjacent bus bars, and each of the portions includes a slit extending in the longitudinal direction of the bus bars and a support portion that supports one part and the other part of the portion which are divided by the slit in the arrangement direction of the bus bars. In this manner, the occurrence of magnetic saturation can be prevented in part of the shield plate and, thus, functional deterioration of the magnetic shield can be prevented.

Recently, current measured by a current detection device has increased more and more and, thus, the sizes of a bus bar, a shield plate, and a cover and a casing for accommodating the bus bar, the shield plate, and the like have increased. If in such a large current detection device (for example, the current sensor described in Japanese Unexamined Patent Application Publication No. 2017-72467) the cover, the casing, or the like is deformed due to a temperature rise, the distance between the detection element and the bus bar and the distance between the detection element and the shield plate are changed from those before the temperature rise. In addition, the distance varies from part to part, which may decrease the current detection accuracy.

SUMMARY

A current detection device is disclosed that is capable of preventing deformation of the casing and the cover caused by the temperature rise and, thus, accurately detecting the magnetic field generated by a measured current flowing through each of the plurality of bus bars and maintaining a high current detection accuracy.

A current detection device includes a casing, a cover fixed to the casing, a plurality of bus bars each having a plate shape, where a current to be measured flows through the bus bar, a plurality of magnetic sensors each configured to detect a magnetic field generated when the current to be measured flows through the bus bar, a substrate having the plurality of magnetic sensors mounted thereon, and a plurality of pairs of shield plates facing each other in a thickness direction of the bus bars. The plurality of magnetic sensors are disposed so as to correspond to the plurality of bus bars in a one-to-one manner and face the bus bars in the thickness direction of the bus bars. Each of the pairs of shield plates comprise a first shield plate and a second shield plate and is disposed so as to sandwich the bus bar and the magnetic sensor in the thickness direction of the bus bar. The plurality of first shield plates adjacent to the magnetic sensors are an integral part of the cover. At least part of the cover is separated between adjacent two of the first shield plates, and the plurality of second shield plates disposed adjacent to the bus bars are an integral part of the casing. Thus, deformation of the cover can be prevented when the temperature rises, which prevents unequal distances from the magnetic sensor. As a result, magnetic saturation does not occur in one or more of the shield plates. Thus, highly accurate current detection can be made.

DESCRIPTION OF THE EXEMPLARY EMBODIMENTS

A current detection device according to an embodiment of the present invention is described in detail below with reference to the accompanying drawings.

Figure 1:
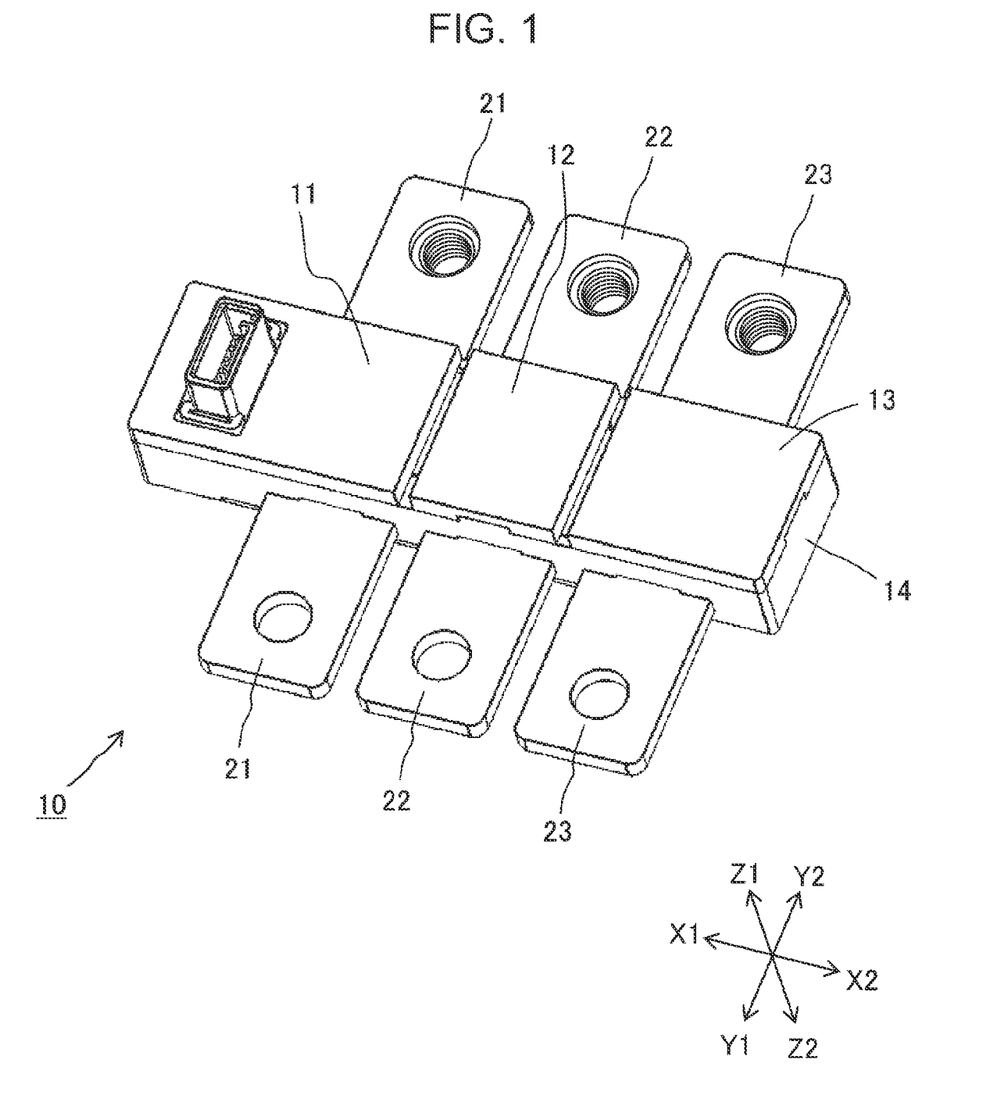
FIG. 1 is a perspective view illustrating the configuration of a current detection device according to a first embodiment of the present invention.
Figure 2A:
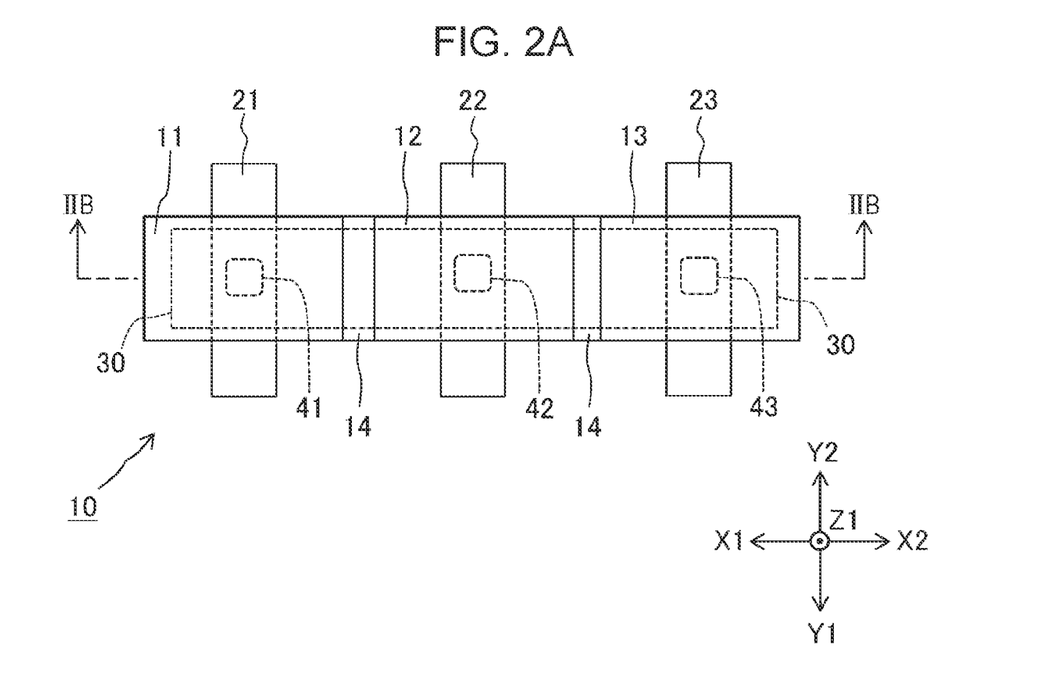
FIG. 2A is a plan view illustrating the configuration of the current detection device according to the first embodiment.
Figure 2B:
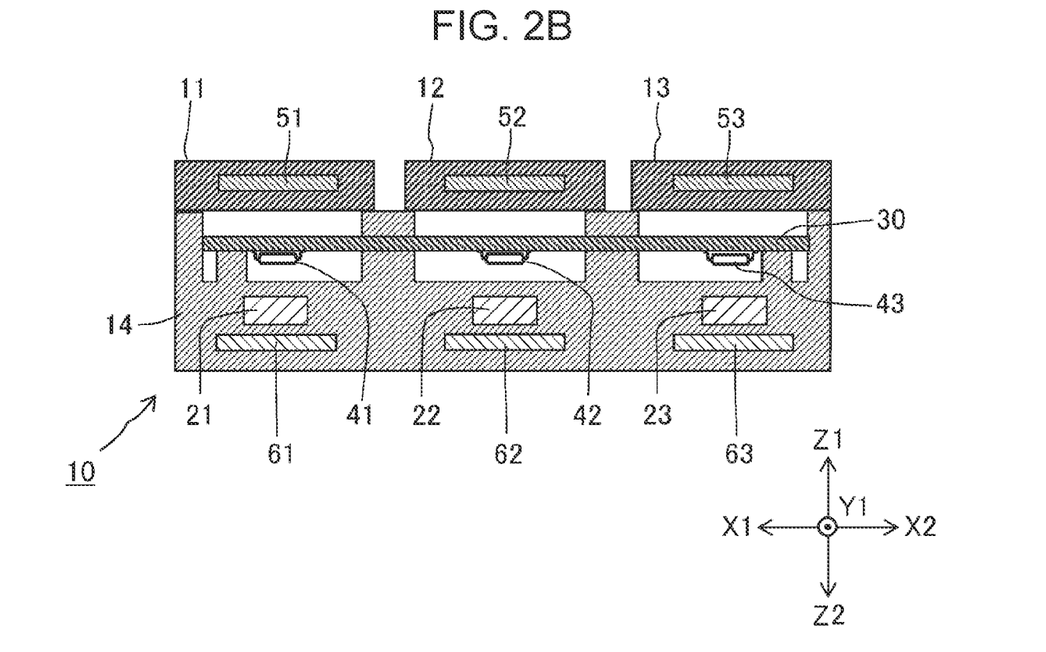
FIG. 2B is a cross-sectional view taken along the line IIB-IIB of FIG. 2A.

FIG. 1 is a perspective view illustrating the configuration of a current detection device 10 according to the first embodiment. FIG. 2A is a plan view illustrating the configuration of the current detection device 10, and FIG. 2B is a cross-sectional view taken along the line IIB-IIB of FIG. 2A. In FIGS. 2A and 2B, part of the configuration illustrated in FIG. 1 is removed, and the configuration is illustrated in a simplified manner.

As illustrated in FIG. 1 and FIGS. 2A and 2B, the current detection device 10 includes three cover members 11, 12, and 13 serving as a cover disposed on the upper side (the Z1 side in FIG. 1 and FIG. 2B) and a case member 14 serving as a casing disposed on the lower side (the Z2 side in FIG. 1 and FIG. 2B). Three bus bars 21, 22, and 23 penetrate the case member 14 in the width direction of the case member 14 (the Y1-Y2 direction in FIG. 1 and FIGS. 2A and 2B). Note that while the embodiment is described with reference to three cover members, three bus bars, three magnetic sensors, and three pairs of upper and lower shield plates, embodiments including two or four or more cover members, bus bars, magnetic sensors, and pairs of upper and lower shield plates are available.

The three cover members 11, 12, and 13 have the same plate-like shape and are disposed at equal intervals in the longitudinal direction of the case member 14 (the X1-X2 direction in FIG. 1 and FIGS. 2A and 2B). The cover members 11, 12, and 13 are all fixed to the case member 14. That is, the cover members fixed to the case member 14 are disposed separately from each other in the longitudinal direction of the case member 14.

The three cover members 11, 12, and 13 have first shield plates 51, 52, and 53 provided therein, respectively.

The first shield plates 51, 52, and 53 are formed by, for example, molding so as to be integrated with the three cover members 11, 12, and 13, respectively. The first shield plates 51, 52, and 53 are disposed to extend in an X-Y plane (a plane including the X1-X2 direction and the Y1-Y2 direction). That is, the plurality of first shield plates adjacent to the magnetic sensors are formed as an integral part of the cover.

In the case member 14, second shield plates 61, 62, and 63 are disposed so as to face the first shield plates 51, 52, and 53 with the bus bars 21, 22, and 23 therebetween in the thickness direction of the bus bars 21, 22, and 23 (the Z1-Z2 direction, the vertical direction), respectively. The second shield plates 61, 62, and 63 are formed by, for example, molding so as to be an integral part of the case member 14 and are disposed separately from each other in the longitudinal direction of the case member 14 (the X1-X2 direction) so as to extend in the X-Y plane. As a result, the first shield plate 51 and the second shield plate 61 form a pair, the first shield plate 52 and the second shield plate 62 form a pair, and the first shield plate 53 and the second shield plate 63 form a pair. In this way, three pairs of shield plates are formed.

The three bus bars 21, 22, and 23 are made of plate-like conductive materials having the same shape and are disposed so that the two facing plate surfaces correspond to the upper and lower sides (in the Z1-Z2 direction) of the case member 14, respectively. The bus bars 21, 22, and 23 extend in the width direction of the case member 14 (the Y1-Y2 direction) so as to have band shapes. The bus bars 21, 22, and 23 are disposed at equal intervals in the longitudinal direction of the case member (the X1-X2 direction in FIGS. 1 and FIGS. 2A and 2B). The three bus bars 21, 22, and 23 are sandwiched in the thickness direction thereof by the three pairs of shield plates (the pair consisting of the first shield plate 51 and the second shield plate 61, the pair consisting of the first shield plate 52 and the second shield plate 62, and the pair consisting of the first shield plate 53 and the second shield plate 63), respectively.

As illustrated in FIG. 2B, a circuit substrate 30 is disposed in the case member 14 so as to extend in the longitudinal direction (the X1-X2 direction), and magnetic sensors 41, 42, and 43 are mounted on the bottom surface of the circuit substrate 30 at positions in the X-Y plane corresponding to the bus bars 21, 22, and 23, respectively. Note that the magnetic sensors 41, 42, and 43 may be provided on either the upper surface or the lower surface of the circuit substrate 30.

In terms of the magnetic sensors 41, 42, and 43, the positions of the magnetic sensors 41, 42, and 43 relative to the bus bars 21, 22, and 23, respectively, are all the same. The positions of three pairs of shield plates (the pair consisting of the first shield plate 51 and the second shield plate 61, the pair consisting of the first shield plate 52 and the second shield plate 62, and the pair consisting of the first shield plate 53 and the second shield plate 63) relative to the magnetic sensors 41, 42, and 43, respectively, are all the same. In addition, the operations and effects of the positions are all the same. Accordingly, the magnetic sensor 42 is described below as an example.

As illustrated in FIG. 2A or FIG. 2B, the magnetic sensor 42 is disposed at a position corresponding to the midpoint of the bus bar 22 in the longitudinal direction (the Y1-Y2 direction), and the bus bar 22 and the magnetic sensor 42 face each other in the vertical direction. In addition, the magnetic sensor 42 is disposed to face the bus bar 22 so that the positions in the width direction (the X1-X2 direction) of the magnetic sensor 42 and the bus bar 22 correspond to each other in the X-Y plane. Since the magnetic sensor 42 is disposed so as to correspond to the bus bar 22 in this way, the magnetic sensor 42 can measure the current value of a current to be measured flowing through the bus bar 22 by detecting the induced magnetic field due to the current (the current to be measured). The magnetic sensor 42 is configured by using, for example, a magnetoresistive element, such as a GMR element (giant magnetoresistive element).

The magnetic sensor 42 is sandwiched from above and below in the thickness direction of the bus bar 22 by a pair consisting of the first shield plate 52 disposed in the cover member 12 and a second shield plate 62 disposed in the case member 14. As a result, the magnetic sensor 42 is disposed so that the magnetic sensor 42 and the bus bar 22 are sandwiched by the first shield plate 52 and the second shield plate 62 in the thickness direction of the bus bar 22. The first shield plate 51 is disposed adjacent to the magnetic sensor 42, and the second shield plate 61 is disposed adjacent to the bus bar 22. Note that the first shield plate 51 can be disposed adjacent to the bus bar 22, while the second shield plate 61 can be disposed adjacent to the magnetic sensor 42.

It is desirable that the first shield plate 52 and the second shield plate 62 be made of a ferromagnetic substance as magnetic shields made of the same magnetic material. The first shield plate 52 and the second shield plate 62 are disposed parallel so as to face each other in the vertical direction. Each of the first shield plate 52 and the second shield plate 62 has a configuration in which a plurality of metal plates having the same rectangular shape in plan view and the same size are stacked in the vertical direction. By arranging the first shield plate 52 and the second shield plate 62 so as to sandwich the magnetic sensor 42 in this way, the magnetic sensor 42 blocks a foreign magnetic field (an external magnetic field), such as an induced magnetic field due to the current flowing through the adjacent bus bars 21 and 23, and prevents the influence of the foreign magnetic field.

Even when for example, a large current is passed through the bus bar 21, 22, or 23 and, thus, the temperature rises significantly, the above-described configuration can reduce the deformation since the cover members 11, 12, and 13 are separated from each other. In addition, even when the high temperature condition continues, heat can be easily dissipated and, thus, deformation is less likely to occur. That is, if the cover members 11, 12, and 13 are integrally formed without partial separation, the cover members are likely to warp, and the placement positions of the first shield plates 51, 52, and 53 are likely to be shifted. The shift of the placement positions deteriorates the shielding performance and, thus, the detection accuracy may decrease. Accordingly, the configuration of the present embodiment can accurately detect the magnetic field generated by the current to be measured flowing through each of the bus bars 21, 22, and 23 as at a normal temperature and can maintain the current detection accuracy even when a large current is passed.

Figure 3A:
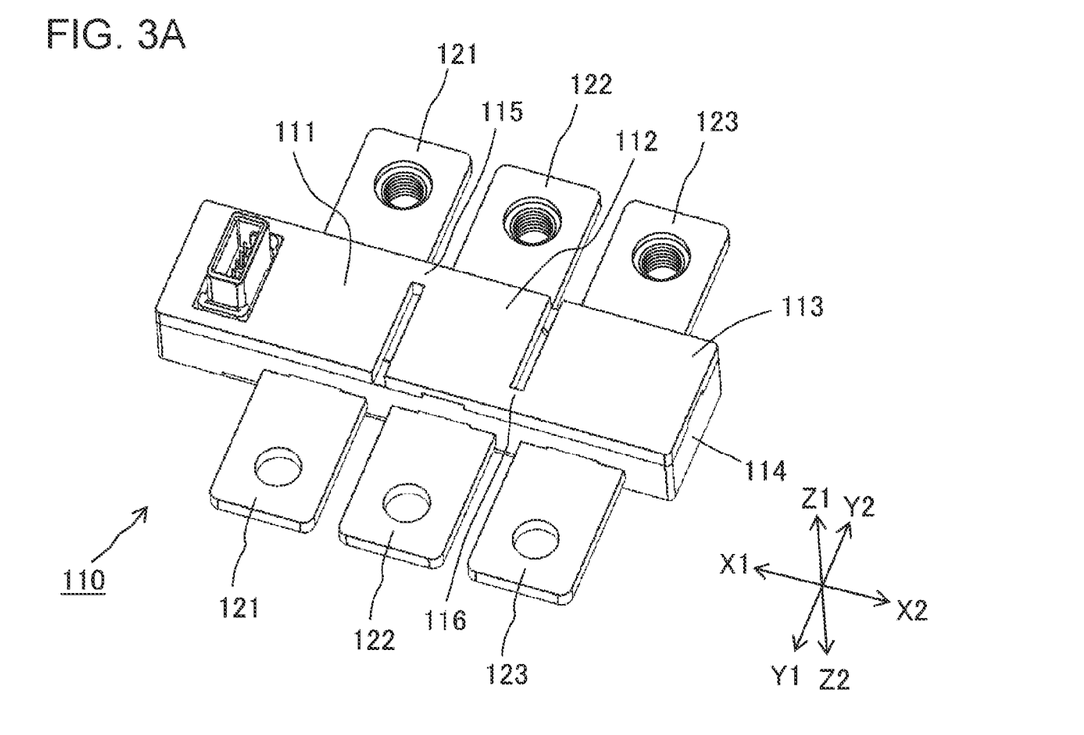
FIG. 3A is a perspective view illustrating the configuration of a current detection device according to a modification of the first embodiment.
Figure 3B:
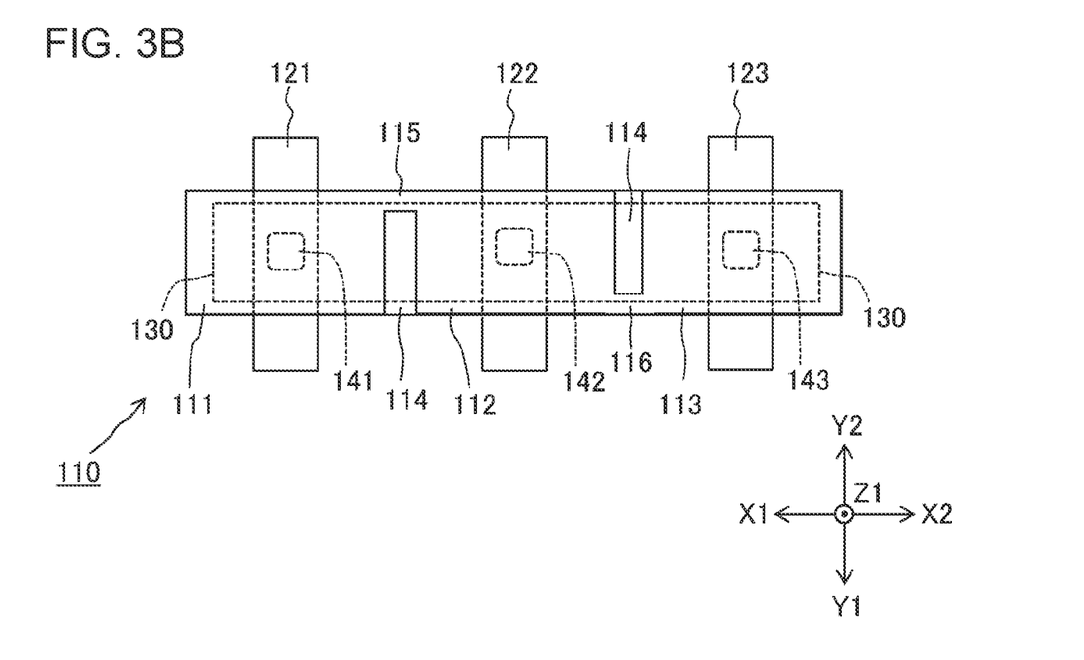
FIG. 3B is a plan view of the current detection device illustrated in FIG. 3A.

Modifications are described below. FIG. 3A is a perspective view illustrating the configuration of a current detection device 110 according to a modification of the first embodiment, and FIG. 3B is a plan view of the current detection device 110. In FIG. 3B, part of the configuration illustrated in FIG. 3A is removed, and the configuration is illustrated in a simplified manner. As indicated by the current detection device 110 illustrated in FIGS. 3A and 3B, instead of the three separate cover members 11, 12, and 13 illustrated in FIG. 1 and FIGS. 2A and 2B, the cover members 111, 112, and 113 that form a cover is connected to each other. That is, the cover is partially separated into two sides between the first shield plates, and the two sides are still connected to each other by the unseparated portion of the cover. In this manner, a slit or a notch extending in the front-rear direction (the Y1-Y2 direction) is formed between adjacent cover members.

According to the modification, a case member 114 (a casing), three bus bars 121, 122, and 123, a circuit substrate 130, three magnetic sensors 141, 142, and 143, and second shield plates (not illustrated) have the same configuration and placement position as the case member 14 (the casing), the three bus bars 21, 22, and 23, the circuit substrate 30, the three magnetic sensors 41, 42, and 43, and the second shield plates 61, 62, and 63 illustrated in FIG. 1 and FIGS. 2A and 2B, respectively.

Like the cover members 11, 12, and 13 illustrated in FIG. 1 and FIGS. 2A and 2B, the three cover members 111, 112, and 113 have the same plate-like shape and are disposed at equal intervals in the longitudinal direction of the case member 114 (the X1-X2 direction). Furthermore, the two adjacent cover members 111 and 112 are connected by a first connecting portion 115 extending in the longitudinal direction of the case member 114, and the two adjacent cover members 112 and 113 are connected by a second connecting portion 116 extending in the longitudinal direction of the case member 114. The three cover members 111, 112, and 113 and the two connecting portions 115 and 116 are integrally formed of the same material by, for example, molding so as to have the same thickness and extend in the X-Y plane. The first shield plates 51, 52, and 53 are provided in the three cover members 111, 112, and 113, respectively, like those illustrated in FIG. 2B.

In the example illustrated in FIGS. 3A and 3B, the first connecting portion 115 is disposed on the back side (the Y2 side), and the second connecting portion 116 is disposed on the front side (the Y1 side) in the X-Y plane. However, the positions in the front-rear direction (the Y1-Y2 direction) and the widths of the two connecting portions 115 and 116 can be freely determined in accordance with the required detection accuracy, the amounts of deformation of the three cover members 111, 112, and 113, and the like.

As described above, the three cover members 111, 112, and 113 are connected together by the two connecting portions 115 and 116, and a cover partially separated between the adjacent first shield plates is formed. The range of separation and the size and shape of the connecting portion can be determined freely. The cover can be fixed to the case member 114 by fixing either or both of a set of the three cover members 111, 112, and 113 and a set of the two connecting portions 115 and 116 to the case member 114.

By configuring the cover in this way, the effect of preventing deformation caused by temperature rise can be obtained, and the assemblability of the cover can be improved in the manufacturing process of the current detection device 110.

Figure 4A:
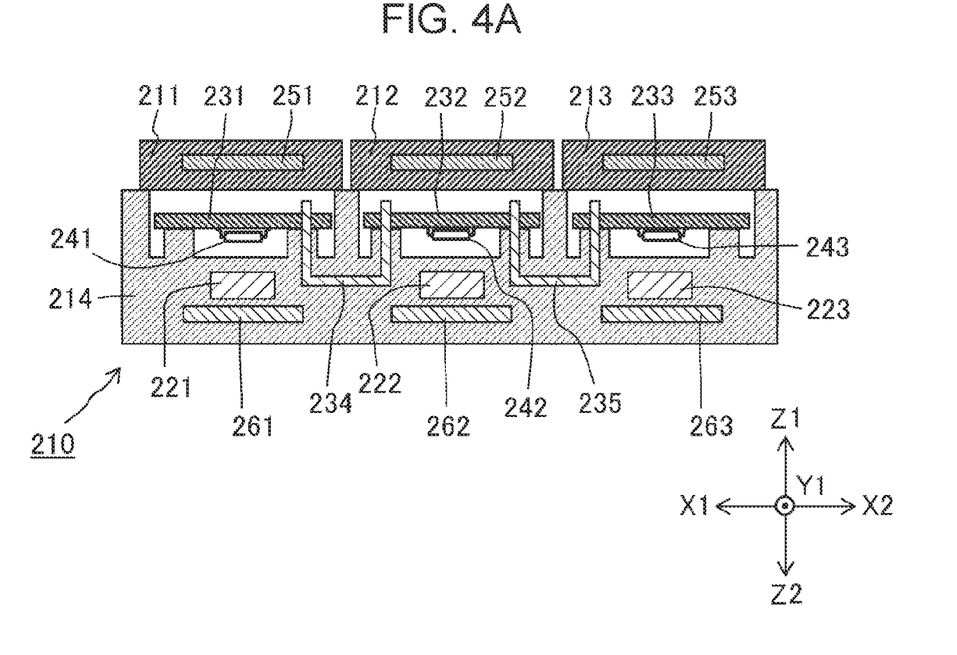
FIG. 4A is a cross-sectional view illustrating the configuration of a current detection device according to a second embodiment.
Figure 4B:
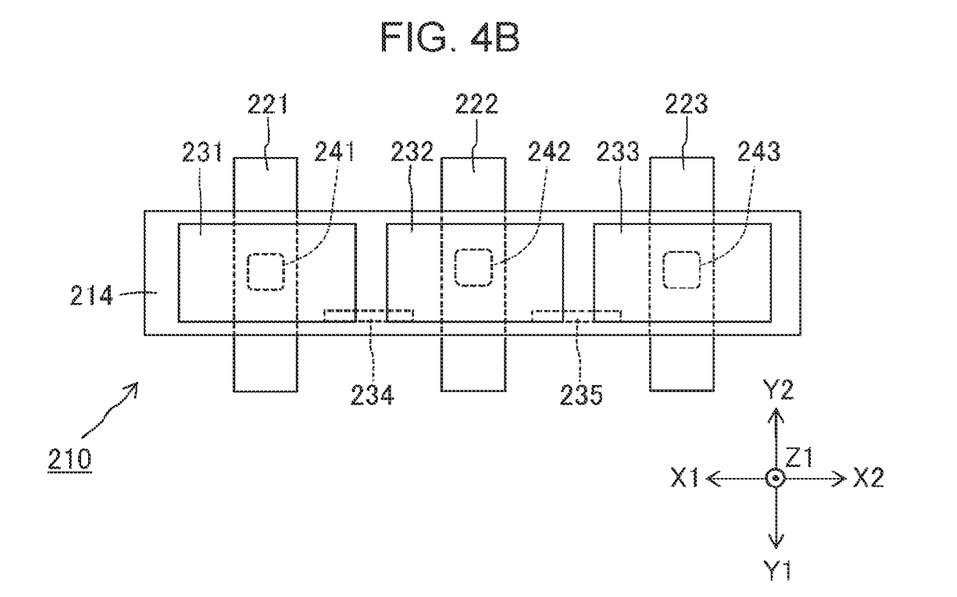
FIG. 4B is a plan view illustrating the current detection device illustrated in FIG. 4A with a cover member removed.

FIG. 4A is a cross-sectional view illustrating the configuration of a current detection device 210 according to the second embodiment and is a diagram of the configuration around the location corresponding to that in FIG. 2B. FIG. 4B is a plan view of the current detection device 210 with cover members 211, 212, and 213 removed.

In the current detection device 210 according to the second embodiment, instead of the circuit substrate 30 according to the first embodiment illustrated in FIGS. 2A and 2B, three circuit substrates 231, 232, and 233 are used which are obtained by separating a circuit substrate between every adjacent two of magnetic sensors 241, 242, and 243. The circuit substrates 231, 232, and 233 are disposed on a case member 214 at equal intervals in the longitudinal direction of the case member 214 (the X1-X2 direction) and are fixed to the case member 214. The two adjacent circuit substrates 231 and 232 are electrically connected to each other by a first wiring portion 234 embedded in the case member 214, and the two adjacent circuit substrates 232 and 233 are also electrically connected to each other by a second wiring portion 235 embedded in the case member 214.

Note that in the example illustrated in FIGS. 4A and 4B, both of the two wiring portions 234 and 235 are disposed on the front side (the Y1 side) of the X-Y plane. However, the positions in the front-rear direction (the Y1-Y2 direction) and the widths of the two wiring portions 234 and 235 can be freely determined in accordance with the required detection accuracy, the amounts of deformation of the three circuit substrates 231, 232, and 233, and the like.

The three cover members 211, 212, and 213, the case member 214, three bus bars 221, 222, and 223, the three magnetic sensors 241, 242, and 243, three first shield plates 251, 252, and 253, and three second shield plates 261, 262, and 263 have the same configurations and placement positions as the three cover members 11, 12, and 13, the case member 14, the three bus bars 21, 22, and 23, the three magnetic sensors 41, 42, and 43, the three first shield plates 51, 52, and 53, and the three second shield plates 61, 62, and 63 according to the first embodiment, respectively.

Figure 5A:
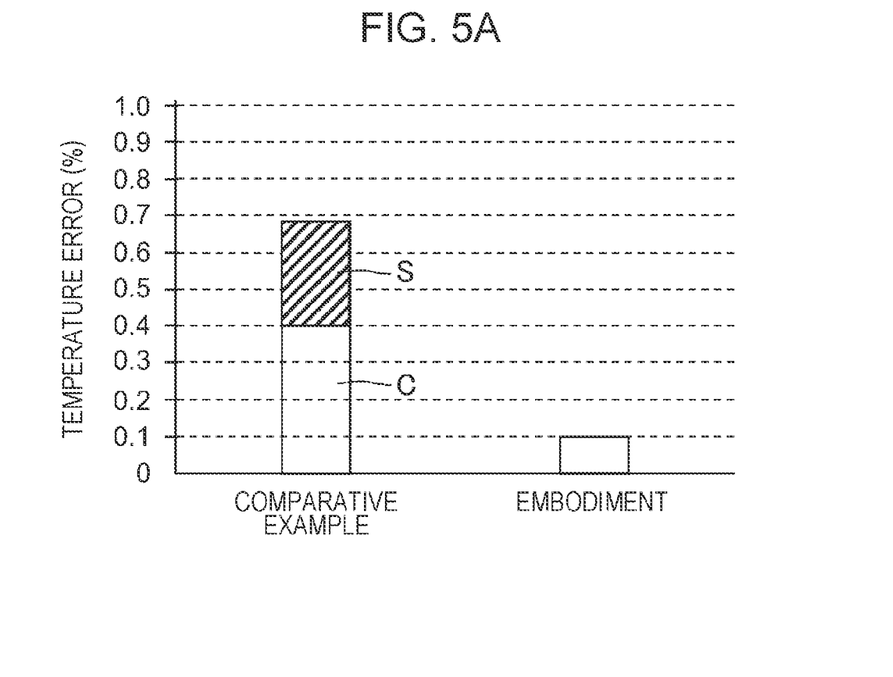
FIG. 5A is a graph illustrating an error in the current detection result at high temperature with respect to the current detection result at room temperature.
Figure 5B:
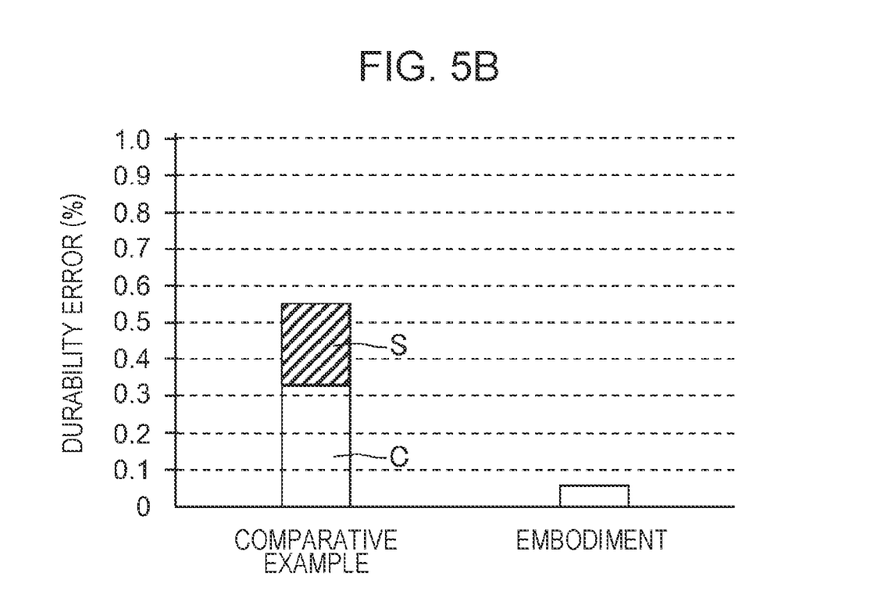
FIG. 5B is a graph illustrating an error in the detection result after 1000-hour continuous current detection at a high temperature with respect to the detection result at the initial stage of the current detection.

FIG. 5A is a graph illustrating an error in the current detection result (the ordinate in FIG. 5A: the temperature error) at high temperature (125° C.) with respect to the current detection result at room temperature (25° C.). FIG. 5B is a graph illustrating an error in the detection result (the ordinate in FIG. 5B: the durability error) after 1000-hour continuous current detection at a high temperature (125° C.) with respect to the detection result at the initial stage of the current detection. In FIGS. 5A and 5B, "embodiment" indicates the error in the case where the current detection device 210 according to the second embodiment is used, and "comparative example" indicates the error in the case where unlike the second embodiment, the cover member has a single-plate structure not divided into three and, in addition, the circuit substrate is a single-plate structure not divided into three.

The S portion and the C portion in the comparative examples illustrated in FIGS. 5A and 5B schematically indicate the ratio of contributions made by deformations of the circuit substrate and the cover member to the error. The S portion indicates the contribution made by the deformation of the circuit substrate to the error, and the C portion indicates the contribution made by the deformation of the cover member to the error.

As can be seen from FIGS. 5A and 5B, according to the embodiment, the temperature error is about 0.1%, and the durability error is less than 0.1%. Thus, the influence of high temperature is reduced. The deformation of each of the members, such as the cover member, due to temperature rise is prevented, and the distance between the magnetic sensor and the bus bar and the distance between the magnetic sensor and each of the first shield plate and the second shield plate are maintained almost constant. In contrast, according to the comparative example, the temperature error is about 7 times that of the embodiment, and the durability error is about 10 times that of the embodiment. Thus, the cover member and the circuit substrate are easily deformed due to temperature rise. Since the distance between the magnetic sensor and the bus bar and the distance between the magnetic sensor and each of the first shield plate and the second shield plate change, a large error is generated in the current detection result.

In addition, it can be seen that the S portion and the C portion in the comparative example illustrated in FIGS. 5A and 5B are both several times larger than those according to the embodiment, and deformation of each of the circuit substrate and the cover member has a significant influence on the detection error. Furthermore, as can be seen from comparison of the S portion and the C portion, the influence of the deformation of the cover member is greater. Therefore, even a configuration in which as in the first embodiment, the circuit substrate 30 is composed of a single sheet and the cover is divided into three cover members 11, 12, and 13 can provide the effect of preventing the detection error.

Figure 6A:
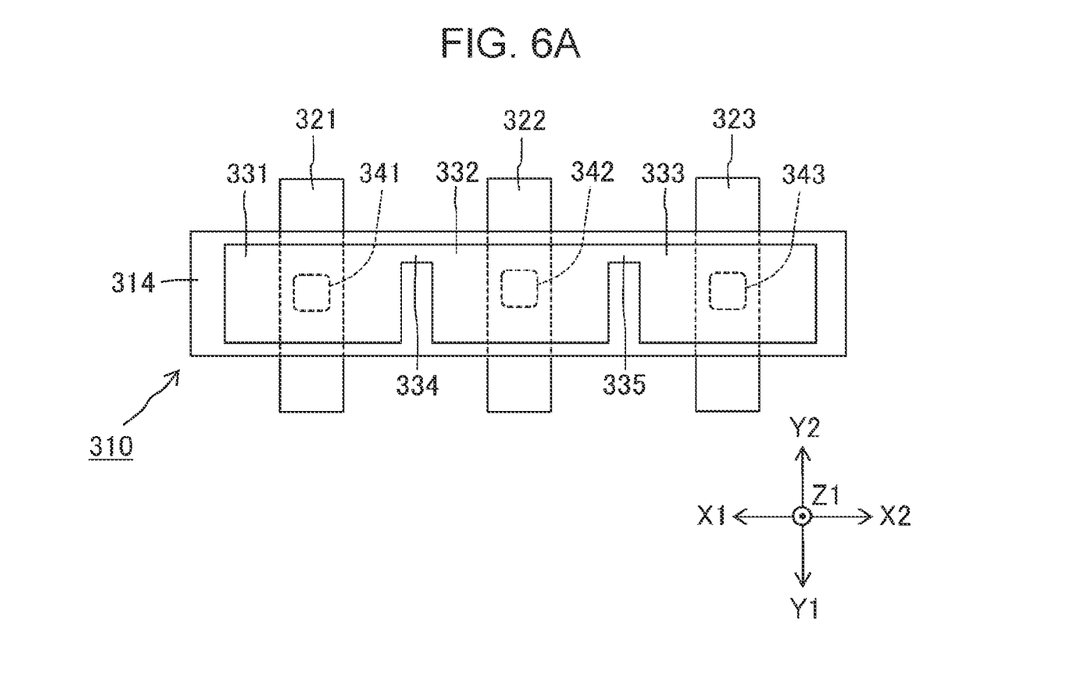
FIG. 6A is a plan view illustrating the configuration of a current detection device according to a first modification of the second embodiment.
Figure 6B:
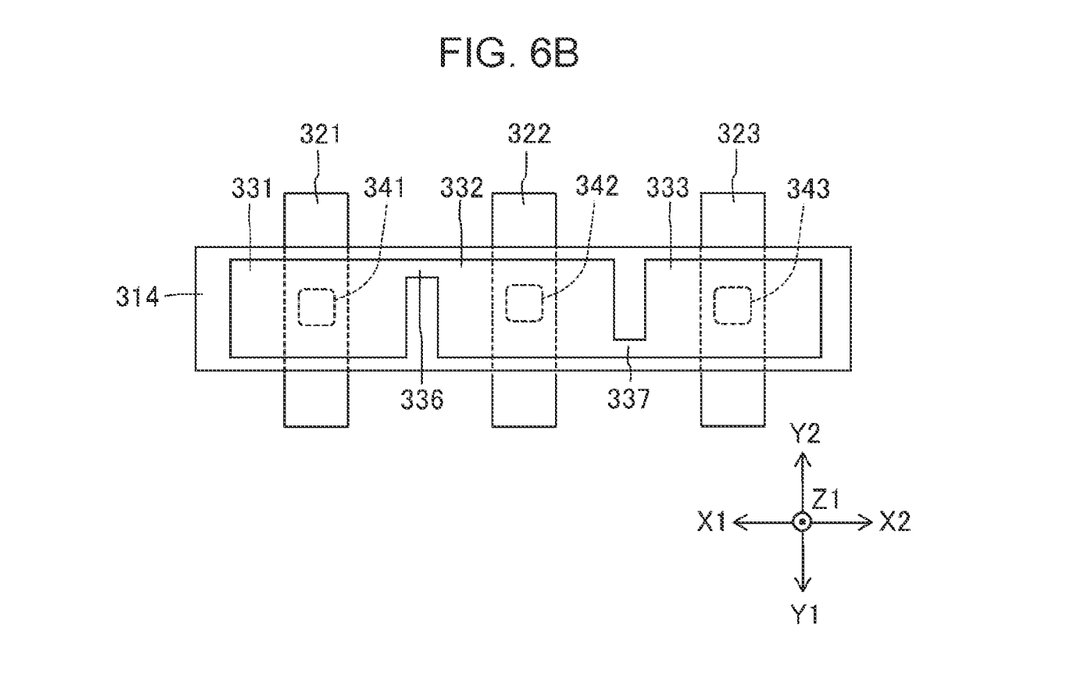
FIG. 6B is a plan view illustrating the configuration of a current detection device according to a second modification of the second embodiment.

Modifications are described below. FIG. 6A is a plan view illustrating the configuration of a current detection device 310 according to a first modification of the second embodiment, and FIG. 6B is a plan view illustrating the configuration of a current detection device according to a second modification of the second embodiment. Like FIG. 4B, FIGS. 6A and 6B are plan views illustrating the current detection devices with the cover member removed.

As illustrated in FIG. 6A, in the current detection device 310 according to the first modification, three circuit substrates 331, 332, and 333 are partially connected to each other without using the two wiring portions 234 and 235 illustrated in FIGS. 4A and 4B. The two adjacent circuit substrates 331 and 332 are connected by a first connecting portion 334 extending in the longitudinal direction of a case member 314 (the X1-X2 direction) and are electrically connected to each other by a first wiring portion (not illustrated) provided in the first connecting portion 334. The two adjacent circuit substrates 332 and 333 are connected to each other by a second connecting portion 335 extending in the longitudinal direction of the case member 314 and are electrically connected to each other by a second wiring portion (not illustrated) provided in the second connecting portion 335. The three circuit substrates 331, 332, and 333 and the two connecting portions 334 and 335 are integrally formed of the same material by, for example, molding so as to have the same thickness and extend in the X-Y plane. That is, the circuit substrate is partially separated into two sides between adjacent magnetic sensors, and the two sides are connected to each other by the unseparated portion.

According to the first modification, the case member 314 (the casing), three bus bars 321, 322, and 323, three magnetic sensors 341, 342, and 343, and second shield plates (not illustrated) have the same configurations and placement positions as the case member 214 (the casing), the three bus bars 221, 222, and 223, the three magnetic sensors 241 242, and 243, and the second shield plates 261, 262, and 263 illustrated in FIG. 4A or FIG. 4B, respectively.

In the example illustrated in FIG. 6A, both of the two connecting portions 334 and 335 are disposed on the back side (the Y2 side) of the X-Y plane. However, the positions in the front-rear direction (the Y1-Y2 direction) and the widths of the two connecting portions 334 and 335 can be freely determined in accordance with the required detection accuracy, the amounts of deformation of three circuit substrates 331, 332, and 333, and the like. For example, like the second modification illustrated in FIG. 6B, a first connecting portion 336 may be disposed on the back side, and a second connecting portion 337 may be disposed on the front side. While the present invention has been described with reference to the above embodiments, the present invention is not limited to the above-described embodiments, and various improvements and changes can be made within the purpose of improvement and the spirit of the invention.

As described above, the current detection device according to the present invention can prevent the deformation of the casing and the cover caused by the temperature rise and, thus, can accurately detect a magnetic field generated by a current to be measured flowing through each of the plurality of bus bars and maintain a high current detection accuracy.

What is claimed is:
1. A current detection device comprising:
a casing;
a cover fixed to the casing;
a plurality of bus bars each having a plate shape, wherein a current to be measured flows through the bus bars in the plurality of bus bars;
a plurality of magnetic sensors each configured to detect a magnetic field generated when the current to be measured flows through the bus bars;
a substrate having the plurality of magnetic sensors mounted thereon, wherein the substrate is composed of a plurality of small substrates provided for each magnetic sensor of the plurality of magnetic sensors, and adjacent small substrates of the plurality of small substrates are connection by a connection portion; and
a plurality of pairs of shield plates facing each other in a thickness direction of the bus bars,
wherein the plurality of magnetic sensors are disposed so as to correspond in a one-to-one manner to the bus bars and face the bus bars in the thickness direction of the bus bars,
wherein each of the pairs of shield plates comprises a first shield plate and a second shield plate and a respective first shield plate and a respective second shield plate are disposed so as to sandwich a respective bus bar and a respective magnetic sensor in the thickness direction of the respective bus bar, and
wherein the plurality of first shield plates are disposed adjacent to the magnetic sensors and are an integral part of the cover, and at least part of the cover is separated between adjacent two of the first shield plates; and
wherein the plurality of second shield plates are disposed adjacent to the bus bars and are an integral part of the casing.

2. The current detection device according to claim 1, wherein the first shield plate is disposed adjacent to the magnetic sensor, and the second shield plate is disposed adjacent to the bus bar.

3. The current detection device according to claim 2, wherein the plurality of second shield plates are an integral part of the casing along with the plurality of bus bars that face the second shield plates.

4. The current detection device according to claim 1, wherein a wiring portion configured to connect adjacent small substrates is formed as an integral part of the casing.

5. The current detection device according to claim 1, wherein the first shield plate and the second shield plate are made of a ferromagnetic material.

6. The current detection device according to claim 5, wherein the first shield plate and the second shield plate are made of the same ferromagnetic material.

7. The current detection device according to claim 1, wherein the sensor comprises a magnetoresistive element.

8. The current detection device according to claim 1, wherein each of the plurality of first shield plates and each of the plurality of second shield plates are metal plates having a same rectangular shape and a same size.

\* \* \* \* \*